(12) United States Patent
Han

(10) Patent No.: US 6,850,659 B2
(45) Date of Patent: **\*Feb. 1, 2005**

(54) GRIN LENS BASED ASTIGMATISM CORRECTING OPTICAL COUPLER

(75) Inventor: Xiaofeng Han, Allentown, PA (US)

(73) Assignee: Agility Communicatioins, Inc., Goleta, CA (US)

( * ) Notice: Subject to any disclaimer, the term of this patent is extended or adjusted under 35 U.S.C. 154(b) by 34 days.

This patent is subject to a terminal disclaimer.

(21) Appl. No.: 10/177,231

(22) Filed: Jun. 21, 2002

(65) Prior Publication Data

US 2003/0048545 A1 Mar. 13, 2003

Related U.S. Application Data

(63) Continuation-in-part of application No. 09/946,827, filed on Sep. 4, 2001
(60) Provisional application No. 60/300,388, filed on Jun. 21, 2001, and provisional application No. 60/296,066, filed on Jun. 4, 2001.

(51) Int. Cl.$^7$ .................................................. G02B 6/26
(52) U.S. Cl. .......................................... 385/15; 385/33

(58) Field of Search ................................. 359/652, 653, 359/654, 708; 385/15, 33, 51, 52; 372/43

(56) References Cited

U.S. PATENT DOCUMENTS

5,802,224 A * 9/1998 Okuta et al. .................. 385/51

OTHER PUBLICATIONS

Zemax, Optical Design Program, User's Guide, Version 10.0, Focus Software, Inc., Apr. 2001, 13 pp.

* cited by examiner

Primary Examiner—Hung Xuan Dang
(74) Attorney, Agent, or Firm—Gates & Cooper LLP

(57) ABSTRACT

An astigmatism-correcting coupler includes a collimating lens for collimating a beam of coherent light output from a laser, a power adjusting lens for reducing any astigmatism of the collimated beam of coherent light output, and a focusing lens for focusing the collimated beam of coherent light output into an optical fiber. The focusing lens is a graded-index (GRIN) focusing lens that is cylindrically polished to have different focal powers in lateral and transverse planes. The cylindrical polished GRIN focusing lens corrects for astigmatic effects by adjusting the power of the light output on the transverse and lateral planes.

35 Claims, 3 Drawing Sheets

GRIN LENS BASED ASTIGMATISM CORRECTING OPTICAL COUPLER

CROSS-REFERENCE TO RELATED APPLICATIONS

This application claims the benefit under 35 U.S.C. §119(e) of the copending and commonly-assigned U.S. Provisional Application Ser. No. 60/300,388, filed Jun. 21, 2001, by Xiaofeng Han, entitled "GRIN LENS BASED ASTIGMATISM CORRECTING OPTICAL COUPLER,", which application is incorporated by reference herein.

This application is a continuation-in-part of the and commonly-assigned U.S. Utility application Ser. No. 09/946,827, filed Sep. 4, 2001, by Xiaofeng Han, entitled "ASTIGMATISM CORRECTING OPTICAL COUPLER,", which claims the benefit under 35 U.S.C. §119(e) of and commonly-assigned U.S. Provisional Application Ser. No. 60/296,066, filed Jun. 4, 2001, by Xiaofeng Han, entitled "ASTIGMATISM CORRECTING OPTICAL COUPLER,", both of which applications are incorporated by reference herein.

BACKGROUND OF THE INVENTION

1. Field of the Invention

The present invention relates generally to optical couplers, and more particularly, to correcting an astigmatism in light output from an edge-emitting diode laser to provide for improved coupling efficiencies between the laser and an optical fiber.

2. Description of the Related Art

Generally, light output from lasers, and most specifically from edge-emitting laser diodes, have a shift in focus position seen in the perpendicular and parallel directions for light emitting from the surface of the laser chip. This is most commonly referred to as astigmatism.

Astigmatism of a light beam results in lower coupling efficiencies into a fiber or other components resulting in a related loss of optical power where any such coupling takes place. As such, what is needed in the art is an astigmatism correcting coupler for coupling a light beam into optical fiber or some other passive or active component.

SUMMARY OF THE INVENTION

To address the issues described above, the present invention discloses an astigmatism-correcting coupler includes a collimating lens for collimating a beam of coherent light output from a laser, a power adjusting lens for reducing any astigmatism of the collimated beam of coherent light output, and a focusing lens for focusing the collimated beam of coherent light output into an optical fiber. The focusing lens is a graded-index (GRIN) focusing lens that is cylindrically polished to have different focal powers in lateral and transverse planes. The cylindrical polished GRIN focusing lens corrects for astigmatic effects by adjusting the power of the light output on the transverse and lateral planes.

BRIEF DESCRIPTION OF THE DRAWINGS

Referring now to the drawings in which like reference numbers represent corresponding parts throughout.

DETAILED DESCRIPTION OF THE PREFERRED EMBODIMENTS

In the following description, reference is made to the accompanying drawings which form a part hereof, and which is shown, by way of illustration, an embodiment of the present invention. It is understood that other embodiments may be utilized and structural changes may be made without departing from the scope of the present invention.

Figure 1:
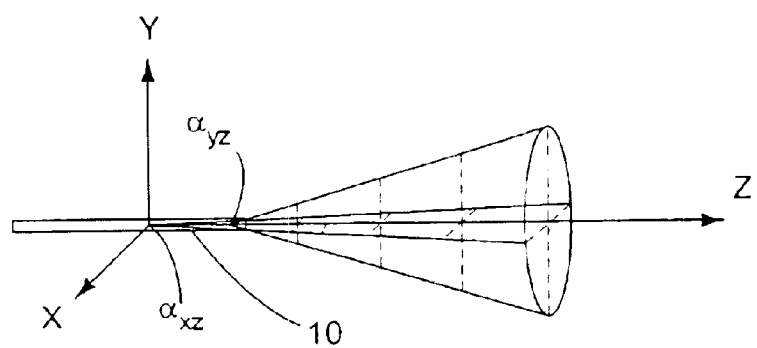
FIG. 1 illustrates the shift in focus position of the astigmatic laser diode output in the y-z plane, or the transverse plane, versus the x-z plane or the lateral plane.

FIG. 1 depicts an edge emitting laser diode 10. The laser diode 10 may be housed in a tunable laser assembly (TLA) (not shown). Generally, the TLA includes a controller, which comprises hardware, software and/or firmware, as well as one or more connectors extending between the controller and the laser diode 10 providing for communication therebetween.

In one embodiment, the light output from the laser diode 10 may have different effective emission points ($a_{xz}$, $a_{yz}$) for the lateral (x-z) and the transverse (y-z) planes, which is commonly referred to as astigmatism.

Figure 2A:
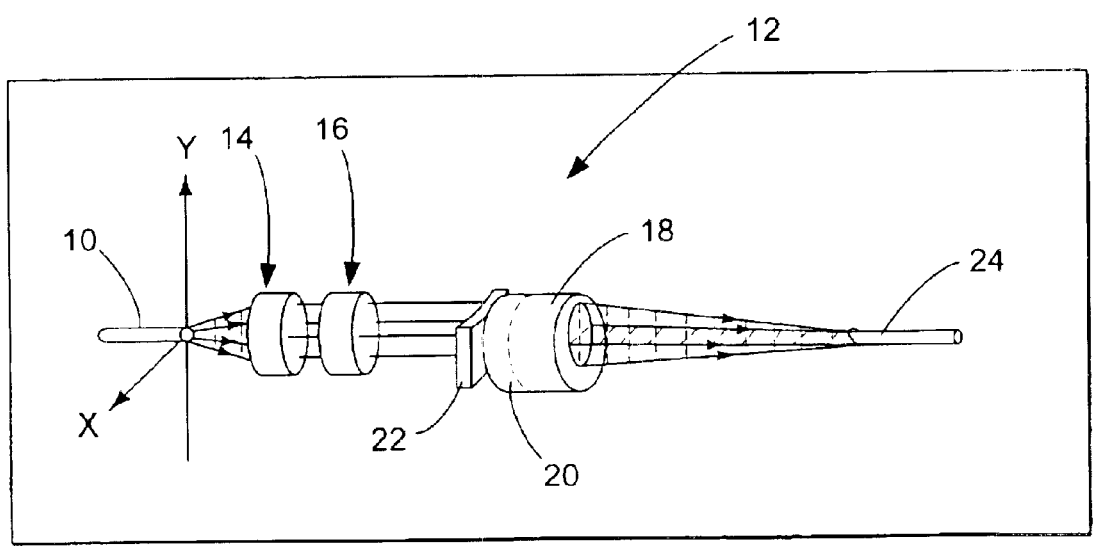
FIG. 2 illustrates an astigmatism correction optical coupler in accordance with a preferred embodiment of the present invention.
Figure 2B:
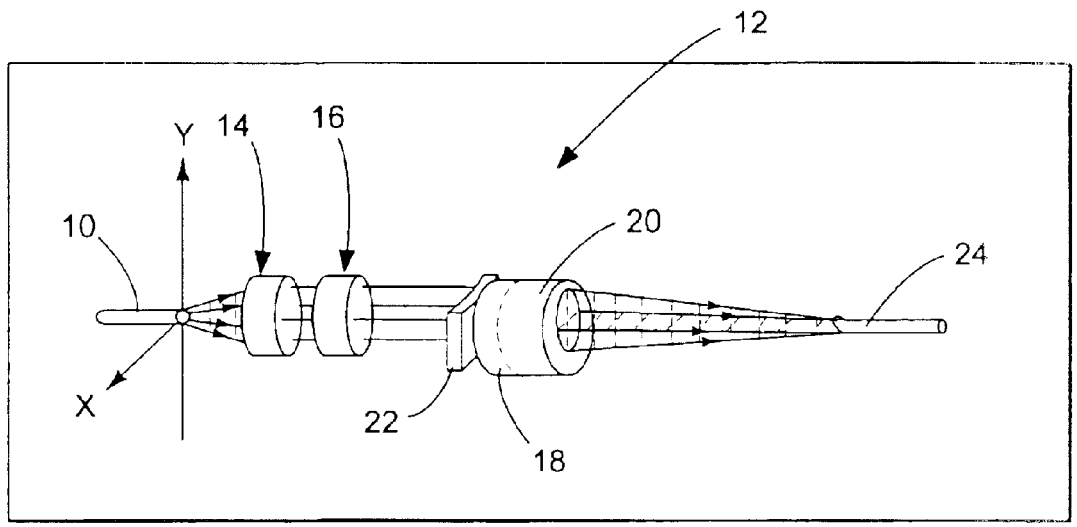
Figure 3:
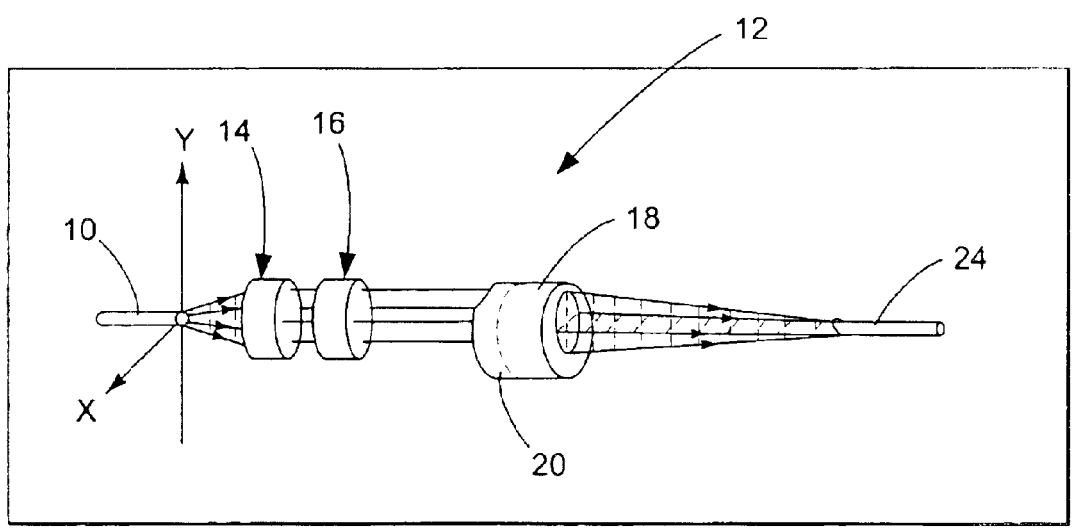
FIG. 3 illustrates an astigmatism correcting optical coupler in accordance with a preferred embodiment of the present invention.

FIGS. 2 and 3 illustrate an astigmatism-correcting coupler 12 used with the laser diode 10 according to the preferred embodiment of the present invention. The astigmatism-correcting coupler 12 includes output optics such as collimating lens 14, optical isolator 16, focusing lens 18, power adjusting lens 20, and optional cylindrical lens 22 (which is shown in FIG. 2 only). These output optics collimate the light output of the laser diode 10, reduce reflection back into the laser diode 10, and collect the light output into a single mode (SM) optical fiber 24.

It is difficult to couple most of the optical power of the light output from the laser diode 10 into the single mode optical fiber 24. As a result, the collimating lens 14 of the anti-astigmatism coupler 12 may be an aspherical or spherical micro-lens, a graded-index (GRIN) lens, or some other lens, for collimating a beam of coherent light output from the laser diode 10.

The optical isolator 16 of the anti-astigmatism coupler 12 substantially eliminates reflections of the light output back towards the laser diode 10. Preferably, the optical isolator 16 is positioned in-between the collimating lens 14 and the focusing lens 18.

The focusing lens 18 of the anti-astigmatism coupler 12 may be a GRIN lens, spherical or aspherical micro lens, or some other lens, for focusing the collimated beam of coherent light output into the single mode optical fiber 24.

Figure 4:
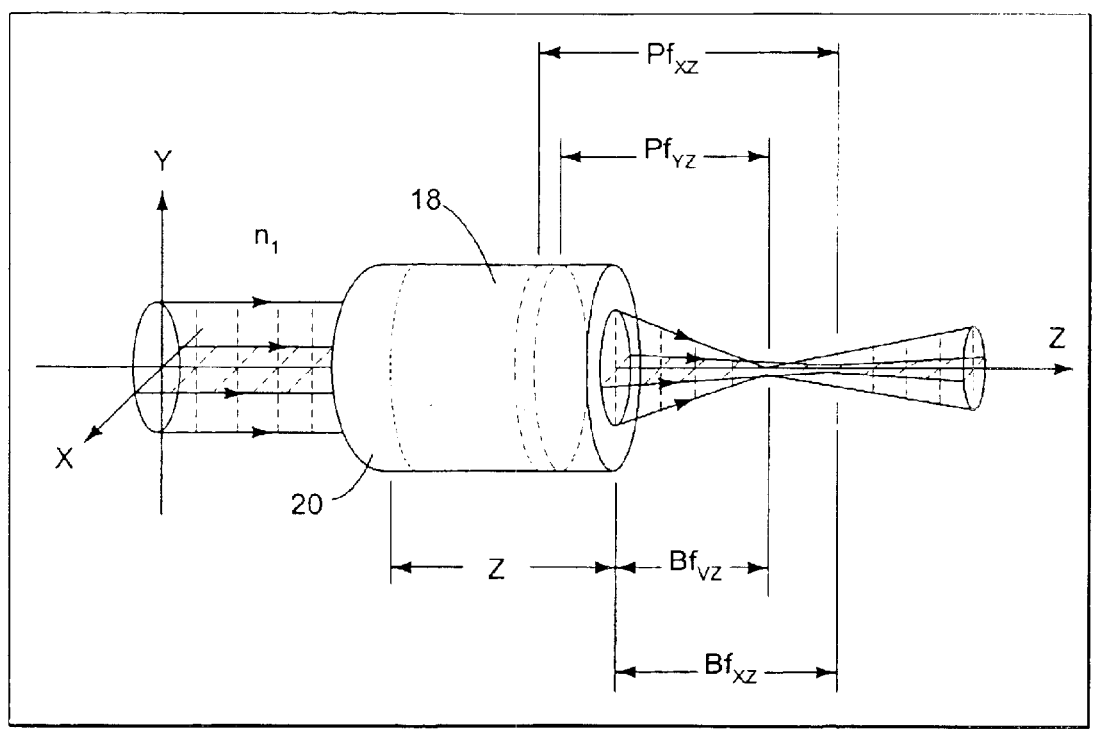
FIG. 4 illustrates an embodiment wherein the power adjusting lens is formed as a part of the focusing lens, the focusing lens 18 is a graded-index (GRIN) lens, and the focusing lens is cylindrically polished with different focal powers in lateral and transverse planes.

Preferably, the power adjusting lens 20 of the anti-astigmatism coupler 12 is positioned intermediate the collimating lens 14 and the focusing lens 18, although the power adjusting lens 20 may be positioned before or after the focusing lens 18. The power adjusting lens 20 is used for reducing any astigmatism of the collimated beam of coherent light output from the laser diode 10. The power adjusting lens 20 may be formed as a part of the focusing lens 18, as shown in FIGS. 2, 3 and 4.

The power adjusting lens 20 increases focal power of the collimated beam of coherent light output on a transverse plane of the optical path, and decreases optical power of the collimated beam of coherent light output on a lateral plane of the optical path. Alternatively, the power adjusting lens 20 increases focal power of the collimated beam of coherent light output on a lateral plane of the optical path, and decreases optical power of the collimated beam of coherent light output on a transverse plane of the optical path. These adjustments by the power adjusting lens 20 thereby reduce any astigmatism of the collimated beam of coherent light output.

The optional cylindrical lens 22 may be added in the optical path. In the preferred embodiment, the focal power of the cylindrical lens 22 is given by:

$$1/Bf_{yz} - 1/Bf_{xz}$$

wherein $Bf_{yz}$ is a back focal length from a last surface of the cylindrical lens 22 to a focal point in a y-z plane and $Bf_{xz}$ is a back focal length from a last surface of the cylindrical lens 22 to a focal point in an x-z plane.

FIG. 4 illustrates an embodiment wherein the power adjusting lens 20 is formed as a part of the focusing lens 18, the focusing lens 18 is a GRIN lens, and the focusing lens 18 is cylindrically polished with different focal powers in lateral and transverse planes. This cylindrical-polished GRIN focusing lens 18 then corrects for astigmatic effects by adjusting the power of the light output on the transverse and lateral planes. If a certain focal power is added on the transverse plane or decreased on the lateral plane in the optical path, the astigmatism can be decreased or eliminated.

GRIN lenses are widely applied in optical coupling systems for laser diodes. GRIN lenses are produced with plano-plano surfaces, and they do not provide for astigmatism correction.

The focal powers of the cylindrically polished GRIN focusing lens 18 are configured by using selected gradient refractive indexes in a radial direction, which have the same function as regular lenses. The focal powers of the cylindrically polished GRIN focusing lens 18 are dependent upon rotational symmetry along an optical axis of the lens 18. The focal length is a function of physical length, index gradient and center index.

A rotational symmetry curve polished surface on the GRIN focusing lens 18 produces more power, either positive or negative, depending on the curvature (convex or concave). It has the same effect as changing the physical length, when other parameters are not changed. If a cylindrical surface is polished on the GRIN focusing lens 18, the power will be added in one direction. It results in non-rotational symmetry focal power, i.e., the focal lengths in the x-z plane and in the y-z plane are not the same.

This type of cylindrical-surface-polished GRIN focusing lens 18 can be used to correct astigmatism in optical coupling systems. As described in more detail below, the curvature calculations are presented for a certain amount of astigmatism. Whether the GRIN focusing lens 18 is concave cylindrical or convex cylindrical depends on the corrected system.

With reference to FIG. 4, the parameters and their symbols used in the calculation are listed as follows:

| | |
|---|---|
| γ | Focal power difference to be corrected, 1/mm, |
| No | Central refractive index of the GRIN lens, |
| √A | Gradient factor, 1/mm, |
| Z | Length of GRIN lens, mm, |

-continued

| | |
|---|---|
| R | Radium of cylindrical surface, mm, |
| $n_1$ | Refractive index in objective space, |
| $n_2$ | Refractive index in image space, |
| C | Curvature of cylindrical surface, 1/mm, where C = (No − $n_1$)/ (No R), |
| $Bf_{xz}$ | Back focal length in the x-z plane, |
| $Bf_{yz}$ | Back focal length in the y-z plane, |
| $Pf_{xz}$ | Focal power in the x-z plane, and |
| $Pf_{yz}$ | Focal power in the y-z plane. |

Correction Based on Rear Focal Lengths

The following describes the equations for correction based on rear focal lengths.

On an x-z plane:

$$Bf_{xz} = \frac{n_2 \cos(Z\sqrt{A})}{No\sqrt{A} \sin(Z\sqrt{A})} \quad (1)$$

On a y-z plane:

$$Bf_{yz} = \frac{n_2 \left[\cos(Z\sqrt{A}) - \left(\frac{C_{yz}}{\sqrt{A}}\right)\sin(Z\sqrt{A})\right]}{No\left[\sqrt{A}\sin(Z\sqrt{A}) + C_{yz}\cos(Z\sqrt{A})\right]} \quad (2)$$

For correction of the focal power difference:

$$\frac{1}{Bf_{yz}} - \frac{1}{Bf_{xz}} = \gamma \quad (3)$$

Substitute Eq. (1) and Eq. (2) into Eq. (3) to obtain:

$$\gamma + \frac{No\sqrt{A}\sin(Z\sqrt{A})]}{n_2\cos(Z\sqrt{A})]} = \quad (4)$$

$$\frac{No[\sqrt{A}\sin(Z\sqrt{A}) + C_{yz}\cos(Z\sqrt{A})]}{n_2\left[\cos(Z\sqrt{A}) - \left(\frac{C_{yz}}{\sqrt{A}}\right)\sin(Z\sqrt{A})\right]}$$

Let:

$$B = \frac{n_2}{No}\left(\gamma + \frac{No\sqrt{A}\sin(Z\sqrt{A})}{n_2\cos(Z\sqrt{A})}\right) \quad (5)$$

This provides:

$$B = \frac{\sqrt{A}\sin(Z\sqrt{A}) + C_{yz}\cos(Z\sqrt{A})}{\cos(Z\sqrt{A}) - \left(\frac{C_{yz}}{\sqrt{A}}\right)\sin(Z\sqrt{A})} \quad (6)$$

Simplifying Eq. (6):

$$B\cos(Z\sqrt{A}) - \frac{BC_{yz}}{\sqrt{A}}\sin(Z\sqrt{A}) = \sqrt{A}\sin(Z\sqrt{A}) + C_{yz}\cos(Z\sqrt{A}) \quad (7)$$

Find $C_{yz}$ from Eq. (7):

$$C_{yz} = \frac{B\cos(Z\sqrt{A}) - \sqrt{A}\sin(Z\sqrt{A})}{\cos(Z\sqrt{A}) + \frac{B}{\sqrt{A}}\sin(Z\sqrt{A})} \quad (8)$$

Thus, a radium of the cylindrical-polished GRIN focusing lens 18 based on rear focal lengths comprises:

$$R_{yz} = \frac{No - n_1}{NoC} = \left(\frac{No - n_1}{No}\right)\frac{\cos(Z\sqrt{A}) + \frac{B}{\sqrt{A}}\sin(Z\sqrt{A})}{B\cos(Z\sqrt{A}) - \sqrt{A}\sin(Z\sqrt{A})} \quad (9)$$

Correction Based on Effective Rear Focal Lengths

The following describes the equations for correction based on effective rear focal lengths.

On an x-z plane:

$$Pf_{xz} = \frac{n_2}{No\sqrt{A}\sin(Z\sqrt{A})} \quad (10)$$

On a y-z plane:

$$Pf_{yz} = \frac{n_2}{No[\sqrt{A}\sin(Z\sqrt{A}) + C_{yz}\cos(Z\sqrt{A})]} \quad (11)$$

For correction of the focal power difference, $\gamma$:

$$\frac{1}{Pf_{yz}} - \frac{1}{Pf_{xz}} = \gamma \quad (12)$$

Substitute Eq. (10) and Eq. (11) into Eq. (12) to obtain:

$$\gamma + \frac{No\sqrt{A}\sin(Z\sqrt{A})]}{n_2} = \frac{No[\sqrt{A}\sin(Z\sqrt{A}) + C_{yz}\cos(Z\sqrt{A})]}{n_2} \quad (13)$$

Find $C_{yz}$ from Eq. (13):

$$C_{yz} = \frac{n_2 \gamma}{No\sqrt{A}\cos(Z\sqrt{A})} \quad (14)$$

Thus, a radium of the cylindrical-polished GRIN focusing lens 18 based on effective rear focal lengths comprises:

$$R_{yz} = \frac{No - n_1}{NoC} = \left(\frac{No - n_1}{n_2}\right)\sqrt{A}\frac{\cos(Z\sqrt{A})}{\gamma} \quad (15)$$

In the calculations above, as an example, the axis of the cylindrical surface is x. It can also be y, depending on how the power difference is considered. Rear focal length or effective rear focal length considerations depend on the application. Similarly, cylindrical-cylindrical, convex (concave)-cylindrical GRIN focusing lens 18 also can be made for astigmatism correction applications.

Conclusion

This concludes the description of the preferred embodiment of the present invention. The foregoing description of the embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

What is claimed is:

1. An astigmatism-correcting coupler, comprising:
    (a) a collimating lens for collimating a beam of coherent light output from a laser;
    (b) a power adjusting lens for reducing any astigmatism of the collimated beam of coherent light output; and
    (c) a focusing lens for focusing the collimated beam of coherent light output into an optical fiber position after a focusing lens.

2. The astigmatism-correcting coupler of claim 1, further comprising an optical isolator, positioned in-between the collimating lens and the focusing lens, for substantially eliminating reflections of the light output back towards the laser.

3. The astigmatism-correcting coupler of claim 1, wherein the collimating lens is a lens selected from a group of lenses comprises an aspherical micro-lens, a spherical micro-lens, or a graded-index (GRIN) lens.

4. The astigmatism-correcting coupler of claim 1, wherein the focusing lens is a lens selected from a group of lenses comprises an aspherical micro-lens, a spherical micro-lens, or a graded-index (GRIN) lens.

5. The astigmatism-correcting coupler of claim 1, wherein the power adjusting lens is positioned before the focusing lens in an optical path of the coupler.

6. The astigmatism-correcting coupler of claim 1, wherein the power adjusting lens is positioned after the focusing lens in an optical path of the coupler.

7. The astigmatism-correcting coupler of claim 1, wherein the power adjusting lens increases focal power of the collimated beam of coherent light output on a transverse plane of an optical path, and decreases optical power of the collimated beam of coherent light output on a lateral plane of the optical path, thereby reducing any astigmatism of the collimated beam of coherent light output.

8. The astigmatism-correcting coupler of claim 1, wherein the power adjusting lens increases focal power of the collimated beam of coherent light output on a lateral plane of an optical path, and decreases optical power of the collimated beam of coherent light output on a transverse plane of the optical path, thereby reducing any astigmatism of the collimated beam of coherent light output.

9. The astigmatism-correcting coupler of claim 1, further comprising a cylindrical lens, wherein a focal power of the cylindrical lens is given by:

$$1/Bf_{yz} - 1/Bf_{xz}$$

wherein:

$Bf_{yz}$ is a back focal length from a last surface of the cylindrical lens to a focal point in a y-z plane, and $Bf_{xz}$ is a back focal length from a last surface of the cylindrical lens to a focal point in a x-z plane.

10. The astigmatism-correcting coupler of claim 1, wherein the power adjusting lens is formed as a part of the focusing lens.

11. The astigmatism-correcting coupler of claim 10, wherein the focusing lens is a graded-index (GRIN) focusing lens, and the GRIN focusing lens is cylindrically polished to have different focal powers in lateral and transverse planes.

12. The astigmatism-correcting coupler of claim 11, wherein the focusing lens is a graded-index (GRIN) focusing lens, the GRIN focusing lens is cylindrically polished to have different focal powers in lateral and transverse planes, and the cylindrical polished GRIN focusing lens corrects for astigmatic effects by adjusting the power of the light output on transverse and lateral planes.

13. The astigmatism-correcting coupler of claim 12, wherein focal powers of the cylindrical polished GRIN focusing lens are configured by using selected gradient refractive indexes in a radial direction.

14. The astigmatism-correcting coupler of claim 13, wherein the focal powers of the cylindrical polished GRIN focusing lens are dependent upon rotational symmetry along an optical axis of the cylindrical polished GRIN focusing lens.

15. The astigmatism-correcting coupler of claim 13, wherein a radium of the cylindrical polished GRIN focusing lens based on rear focal lengths comprises:

$$R_{yz} = \frac{No - n_1}{NoC} = \left(\frac{No - n_1}{No}\right) \frac{\cos(Z\sqrt{A}) + \frac{B}{\sqrt{A}}\sin(Z\sqrt{A})}{B\cos(Z\sqrt{A}) - \sqrt{A}\sin(Z\sqrt{A})}$$

wherein:

| | |
|---|---|
| No | Central refractive index of the GRIN lens, |
| $\sqrt{A}$ | Gradient factor, |
| Z | Length of the GRIN focusing lens, |
| R | Radium of a cylindrical surface of the GRIN focusing lens, |
| $n_1$ | Refractive index in objective space, |
| $n_2$ | Refractive index in image space, |
| C | Curvature of the cylindrical surface, such that C = (No − $n_1$)/No R), |
| B | Rear focal length. |

16. The astigmatism-correcting coupler of claim 13, wherein a radium of the cylindrical polished GRIN focusing lens based on effective rear focal lengths comprises:

$$R_{yz} = \frac{No - n_1}{NoC} = \left(\frac{No - n_1}{n_2}\right) \frac{\sqrt{A}\cos(Z\sqrt{A})}{\gamma}$$

wherein:

| | |
|---|---|
| $\gamma$ | Focal power difference to be corrected, |
| No | Central refractive index of the GRIN focusing lens, |
| $\sqrt{A}$ | Gradient factor, |
| Z | Length of the GRIN focusing lens, |
| R | Radium of a cylindrical surface of the GRIN focusing lens, |
| $n_1$ | Refractive index in objective space, and |
| C | Curvature of the cylindrical surface, such that C = (No − $n_1$)/(No R). |

17. A method for correcting an astigmatism in a light beam, comprising:
  (a) collimating a beam of coherent light output from a laser using a collimating lens;
  (b) reducing any astigmatism of the collimated beam of coherent light output using a power adjusting lens; and
  (c) focusing the collimated beam of coherent light output into an optical fiber position after a focusing lens using the focusing lens.

18. The method of correcting an astigmatism of claim 17, further comprising substantially eliminating reflections of the light output back towards the laser using an optical isolator positioned in-between the collimating lens and the focusing lens.

19. The method of correcting an astigmatism of claim 17, wherein the collimating lens is a lens selected from a group of lenses comprises an aspherical micro-lens, a spherical micro-lens, or a graded-index (GRIN) lens.

20. The method of correcting an astigmatism of claim 17, wherein the focusing lens is a lens selected from a group of lenses comprises an aspherical micro-lens, a spherical micro-lens, or a graded-index (GRIN) lens.

21. The method of correcting an astigmatism of claim 17, wherein the power adjusting lens is positioned before the focusing lens in an optical path of the coupler.

22. The method of correcting an astigmatism of claim 17, wherein the power adjusting lens is positioned after the focusing lens in an optical path of the coupler.

23. The method of correcting an astigmatism of claim 17, wherein the power adjusting lens increases focal power of the collimated beam of coherent light output on a transverse plane of an optical path, and decreases optical power of the collimated beam of coherent light output on a lateral plane of the optical path, thereby reducing any astigmatism of the collimated beam of coherent light output.

24. The method of correcting an astigmatism of claim 17, wherein the power adjusting lens increases focal power of the collimated beam of coherent light output on a lateral plane of an optical path, and decreases optical power of the collimated beam of coherent light output on a transverse plane of the optical path, thereby reducing any astigmatism of the collimated beam of coherent light output.

25. The method of correcting an astigmatism of claim 17, further comprising using a cylindrical lens, wherein a focal power of the cylindrical lens is given by:

$$1/Bf_{yz} - 1/Bf_{xz}$$

wherein:

$Bf_{yz}$ is a back focal length from a last surface of the cylindrical lens to a focal point in a y-z plane, and $Bf_{xz}$ is a back focal length from a last surface of the cylindrical lens to a focal point in a x-z plane.

26. The method of correcting an astigmatism of claim 17, wherein the power adjusting lens is formed as a part of the focusing lens.

27. The method of correcting an astigmatism of claim 26, wherein the focusing lens is a graded-index (GRIN) focusing lens, and the GRIN focusing lens is cylindrically polished to have different focal powers in lateral and transverse planes.

28. The method of correcting an astigmatism of claim 27, wherein the focusing lens is a graded-index (GRIN) focusing lens, the GRIN focusing lens is cylindrically polished to have different focal powers in lateral and transverse planes, and the cylindrical polished GRIN focusing lens corrects for astigmatic effects by adjusting the power of the light output on transverse and lateral planes.

29. The method of correcting an astigmatism of claim 28, wherein focal powers of the cylindrical polished GRIN focusing lens are configured by using selected gradient refractive indexes in a radial direction.

30. The method of correcting an astigmatism of claim 29, wherein the focal powers of the cylindrical polished GRIN focusing lens are dependent upon rotational symmetry along an optical axis of the cylindrical polished GRIN focusing lens.

31. The method of correcting an astigmatism of claim 29, wherein a radium of the cylindrical polished GRIN focusing lens based on rear focal lengths comprises:

$$R_{yz} = \frac{No - n_1}{NoC} = \left(\frac{No - n_1}{No}\right) \frac{\cos(Z\sqrt{A}) + \frac{B}{\sqrt{A}}\sin(Z\sqrt{A})}{B\cos(Z\sqrt{A}) - \sqrt{A}\sin(Z\sqrt{A})}$$

wherein:

No   Central refractive index of the GRIN lens,
√A   Gradient factor,
Z   Length of the GRIN focusing lens,
R   Radium of a cylindrical surface of the GRIN focusing lens,
$n_1$   Refractive index in objective space,
$n_2$   Refractive index in image space,
C   Curvature of the cylindrical surface, such that C = (No − $n_1$)/(No R),
B   Rear focal length.

32. The method of correcting an astigmatism of claim 29, wherein a radium of the cylindrical polished GRIN focusing lens based on effective rear focal lengths comprises:

$$R_{yz} = \frac{No - n_1}{NoC} = \left(\frac{No - n_1}{n_2}\right) \frac{\sqrt{A}\cos(Z\sqrt{A})}{\gamma}$$

wherein:

γ   Focal power difference to be corrected,
No   Central refractive index of the GRIN focusing lens,
√A   Gradient factor,
Z   Length of the GRIN focusing lens,
R   Radium of a cylindrical surface of the GRIN focusing lens,
$n_1$   Refractive index in objective space, and
C   Curvature of the cylindrical surface, such that C = (No − $n_1$)/(No R).

33. A power adjusting lens for reducing any astigmatism of a beam of coherent light output from a laser, wherein the power adjusting lens increases focal power of the collimated beam of coherent light output on a first plane of an optical path, and decreases optical power of the collimated beam of coherent light output on a second plane of the optical path, thereby reducing any astigmatism of the beam of coherent light output.

34. The power adjusting lens of claim 33, wherein the first plane is a lateral plane of the optical path and the second plane is a transverse plane of the optical path.

35. The power adjusting lens of claim 33, wherein the first plane is a transverse plane of the optical path and the second plane is a lateral plane of the optical path.

\* \* \* \* \*